United States Patent
Hook et al.

(10) Patent No.: US 12,527,076 B2
(45) Date of Patent: Jan. 13, 2026

(54) STACKED FET VERTICAL DIODE

(71) Applicant: International Business Machines Corporation, Armonk, NY (US)

(72) Inventors: Terence Hook, Jericho Center, VT (US); Anthony I. Chou, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 364 days.

(21) Appl. No.: 18/195,701

(22) Filed: May 10, 2023

(65) Prior Publication Data

US 2024/0379658 A1 Nov. 14, 2024

(51) Int. Cl.
*H10D 84/80* (2025.01)
*H10D 8/00* (2025.01)
*H10D 30/43* (2025.01)
*H10D 30/67* (2025.01)
*H10D 62/10* (2025.01)

(52) U.S. Cl.
CPC ........... *H10D 84/811* (2025.01); *H10D 8/422* (2025.01); *H10D 30/43* (2025.01); *H10D 30/6735* (2025.01); *H10D 62/121* (2025.01)

(58) Field of Classification Search
CPC ...... H10D 84/811; H10D 8/422; H10D 30/43; H10D 30/6735; H10D 62/121; H10D 30/6728; H10D 84/038; H10D 88/00; H10D 88/01

See application file for complete search history.

(56) References Cited

U.S. PATENT DOCUMENTS

| | | | |
|---|---|---|---|
| 7,863,112 B2 | 1/2011 | Nair et al. | |
| 7,888,775 B2 | 2/2011 | Russ et al. | |
| 9,006,087 B2 | 4/2015 | Chang et al. | |
| 9,058,992 B2 | 6/2015 | Cheng et al. | |
| 9,431,388 B1 | 8/2016 | Gauthier, Jr. et al. | |
| 9,842,835 B1 | 12/2017 | Cheng et al. | |
| 9,847,391 B1 | 12/2017 | Zang et al. | |
| 9,991,359 B1 | 6/2018 | Balakrishnan et al. | |
| 10,504,890 B2 | 12/2019 | Cheng et al. | |
| 10,692,768 B1 * | 6/2020 | Rubin | H10D 64/017 |
| 11,075,273 B1 | 7/2021 | Reznicek et al. | |
| 11,101,374 B1 | 8/2021 | Reznicek et al. | |
| 2020/0044023 A1 | 2/2020 | Reznicek et al. | |
| 2022/0415925 A1 | 12/2022 | Thomson et al. | |
| 2024/0379657 A1 | 11/2024 | Hook et al. | |

OTHER PUBLICATIONS

Stewart, M., et al., "High performance gated lateral polysilicon PIN diodes", Solid-State Electronics 44, May 2000, pp. 1613-1619.
List of IBM Patents or Patent Applications Treated as Related, dated May 10, 2023, 2 pages.

* cited by examiner

*Primary Examiner* — Mohammad A Rahman
(74) *Attorney, Agent, or Firm* — Scully, Scott, Murphy & Presser, P.C.; Samuel Waldbaum

(57) ABSTRACT

A semiconductor structure including a stacked FET vertical diode is provided. The stacked FET vertical diode includes vertically stacked source/drain regions of opposite conductivity that are electrically connected by a semiconductor material layer that is positioned between the vertically stacked source/drain regions.

20 Claims, 1 Drawing Sheet

STACKED FET VERTICAL DIODE

CROSS REFERENCE TO RELATED APPLICATION

The present application is related to U.S. application Ser. No. 18/195,677, filed concurrently on the same date as the present application, the entire content of this related application is incorporated herein by reference.

BACKGROUND

The present application relates to semiconductor technology, and more particularly to a semiconductor structure including a stacked field effect transistor (FET) vertical diode.

Stacking of FETs is an attractive architecture for future complementary metal oxide semiconductor (CMOS) scaling, and potentially for ultimately scaled technology. By directly stacking FETs one over the other (for example, pFETs over nFETs, nFETs over pFETs, pFETs over pFETs, or nFETs over nFETs) significant area scaling can be achieved.

In stacked FET technology, some of the conventional "passive" devices, i.e., non-transistors, will have to be modified. One such passive device is a diode. A diode is two terminal electronic component that conducts current primarily in one direction (asymmetric conductance). A diode has low (ideally zero) resistance in one direction and high (ideally infinite) resistance in the other direction. Semiconductor diodes are a type of diode that includes a crystalline semiconductor material with a p-n junction connected to two terminals. There is a need to provide a diode that can be implemented in stacked FET technology.

SUMMARY

A semiconductor structure including a stacked FET vertical diode is provided. The stacked FET vertical diode includes vertically stacked source/drain regions of opposite conductivity that are electrically connected by a semiconductor material layer that is positioned between the vertically stacked source/drain regions.

In one aspect of the present application, a semiconductor structure is provided. In one embodiment, the semiconductor structure includes a stacked FET vertical diode located in a diode region of a semiconductor substrate. The stacked FET vertical diode includes a first FET having first conductivity type source/drain regions, and a second FET located above the first FET and having second conductivity type source/drain regions that are of an opposite conductivity than the first conductivity type source/drain regions. The stacked FET vertical diode also includes a semiconductor material layer electrically connecting the first conductivity type source/drain regions of the first FET with the second conductivity type source/drain regions of the second FET. In the present application, a first vertical diode is formed on one side of the stacked first and second FETs, and a second vertical diode is formed on the other side of the stacked first and second FETs.

In some embodiments of the present application, the semiconductor structure can further include a stacked FET located in a stacked FET device region of the semiconductor substrate, wherein the stacked FET device region is located adjacent to the diode region of the semiconductor substrate. In such embodiments, the stacked FET includes a third FET having third conductivity type source/drain regions, and a fourth FET located above the third FET and having fourth conductivity type source/drain regions. In the stacked FET device region, a dielectric material layer electrically insulating the third conductivity type source/drain regions of the third FET from the fourth conductivity type source/drain regions of the fourth FET. In such embodiments, the stacked FET is located at a same device level as the stacked FET vertical.

DETAILED DESCRIPTION

Figure 1:
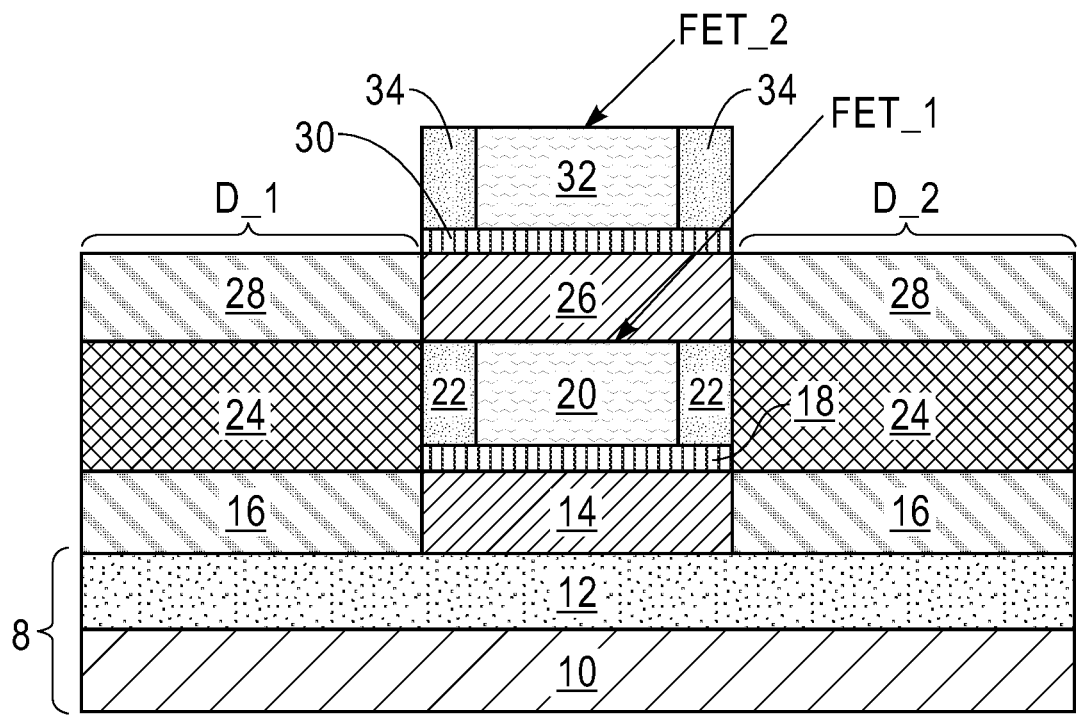
FIG. 1 is a cross sectional view of a stacked FET vertical diode in a diode region of a semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As mentioned above, a semiconductor structure including a stacked FET vertical diode is provided. The stacked FET vertical diode includes vertically stacked source/drain regions of opposite conductivity that are electrically connected by a semiconductor material layer that is positioned between the vertically stacked source/drain regions. Thus, the semiconductor material layer vertically separates the vertically stacked source/drain regions from each other. In the present application, current can flow in a vertical direction. In one example, the vertical direction can be from a bottom source/drain region to a top source/drain region through the semiconductor material layer that is sandwiched between the vertically stacked source/drain regions. This and other aspects of the present application will now be described in greater detail by referring to FIG. 1.

Notably, FIG. 1 illustrates a stacked FET vertical diode of the present application that is located in a diode region of a semiconductor substrate 8. The stacked FET vertical diode includes a first FET, FET_1, having first conductivity type source/drain regions 16, and a second FET, FET_2, located above FET_1 and having second conductivity type source/drain regions 28. As is known to those skilled in the art, a FET includes a pair of source/drain regions that are spaced apart by a semiconductor channel region, and a gate structure including a gate dielectric material and a gate electrode are located on the semiconductor channel region. The second conductivity type source/drain regions 28 are of an opposite conductivity than the first conductivity type source/drain regions 16. Hence and do to the corresponding conductivity of the source/drain regions, FET_1 is of the first conductivity type and FET_2 is of the second conductivity type.

The stacked FET vertical diode also includes a semiconductor material layer 24 electrically connecting the first conductivity type source/drain regions 16 of FET_1 with the second conductivity type source/drain regions 28 of FET_2. In the present application, a first vertical diode, D_1, is formed on one side of the stacked first and second FETs, and a second vertical diode, D_2, is formed on the other side of the stacked first and second FETs.

FET_1 of the stacked FET vertical diode illustrated in FIG. 1 includes a first semiconductor channel material layer 14 located laterally between each of the first conductivity type source/drain regions 16, and FET_2 of the stacked FET vertical diode illustrated in FIG. 1 includes a second semiconductor channel material layer 26 located laterally between each of the second conductivity type source/drain regions 28.

As is further illustrated in FIG. 1, FET_1 includes a first gate dielectric material layer 18 located on the first semiconductor channel material layer 14 and a first gate electrode 20 located on the first gate dielectric material layer 18, while FET_2 includes a second gate dielectric material layer 30 located on the second semiconductor channel material layer 26 and a second gate electrode 32 located on the second gate dielectric material layer 30.

As is further illustrated in FIG. 1, a first gate spacer 22 is located on the first gate dielectric material layer 18 and contacts a sidewall of the first gate electrode 20, and a second gate spacer 34 is located on the second gate dielectric material layer 36 and contacts a sidewall of the second gate electrode 32. As is even further illustrated in FIG. 1, the first gate spacer 22 further contacts the semiconductor material layer 24 that vertically separates the first conductivity type source/drain regions 16 from the second conductivity type source/drain regions 28.

The various components/elements depicted in FIG. 1 will now be described in greater detail. In some embodiments, and as is illustrated in FIG. 1, the semiconductor substrate 8 includes an insulator layer 12 located on a base semiconductor material layer 10. In such embodiments, the insulator layer 12 contacts each of the first conductivity type source/drain regions 16 and the first semiconductor channel material layer 14. In other embodiments (not specifically illustrated, but can be readily derived from FIG. 1), the semiconductor substrate 8 includes base semiconductor material layer 10. In such embodiments, the base semiconductor material layer 10 can contact each of the first conductivity type source/drain regions 16 and the first semiconductor channel material layer 14.

The base semiconductor material layer 10 is composed of a first semiconductor material having semiconducting properties. Examples of first semiconductor materials that can be used to provide the base semiconductor material layer 10 include, but are not limited to, silicon (Si), a silicon germanium (SiGe) alloy, a silicon germanium carbide (SiGeC) alloy, germanium (Ge), III/V compound semiconductors or II/VI compound semiconductors. The base semiconductor material layer 10 can be composed of one or more of these first semiconductor materials. In one example, the first semiconductor material that provides the base semiconductor material layer 10 is composed of silicon. In some embodiments, the first semiconductor material layer that provides the base semiconductor material layer 10 can be undoped, i.e., an intrinsic, semiconductor material. In other embodiments, the first semiconductor material that provides the base semiconductor material layer 10 can be doped with an n-type dopant or p-type dopant.

The term "p-type dopant" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type dopant" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, first semiconductor material that provides the base semiconductor material layer 10 can typically have a dopant concentration of from 1e15 atoms/cm$^3$ to 1e16 atoms/cm$^3$.

The insulator layer 12 that can be optionally present includes any dielectric material such as, for example, silicon dioxide and/or boron nitride. When present, the insulator layer 12 can have a thickness from 1 nm to 25 nm; although other thicknesses for the insulator layer 12 are contemplated and can be employed in the present application.

The first semiconductor channel material layer 14 is composed of a second semiconductor material. The second semiconductor material that provides the first semiconductor channel material layer 14 can include one of the semiconductor materials mentioned above for the first semiconductor material that provides the base semiconductor material layer 10. In one example, the second semiconductor material that provides the first semiconductor channel material layer 14 is composed of Si or Ge. In some embodiments, the second semiconductor material that provides the first semiconductor channel material layer 14 is capable of providing high channel mobility for an nFET. In other embodiments, the second semiconductor material that provides the first semiconductor channel material layer 14 is capable of providing high channel mobility for a pFET. The first semiconductor channel material layer 14 can have a thickness from 20 nm to 50 nm; although other thicknesses for the first semiconductor channel material layer 14 are contemplated and can be employed in the present application.

The first conductivity-type source/drain regions 16 are composed of a third semiconductor material that can be compositionally the same as, or compositionally different from, the second semiconductor material that provides the first semiconductor channel material layer 14. Typically, the third semiconductor material that provides the first conductivity-type source/drain regions 16 and the second semiconductor material that provides the first semiconductor channel material layer 14 are compositionally the same, e.g., both are composed of Si. The third semiconductor material that provides the first conductivity-type source/drain regions 16 is doped with either a p-type dopant, as defined above, or an n-type dopant, as defined above. In one example, a p-type dopant is employed, and the first conductivity-type source/drain regions 16 are p-doped regions. In another example, an n-type dopant is employed, and the first conductivity-type source/drain regions 16 are n-doped regions. The first conductivity-type source/drain regions 16 can have a dopant (p-type or n-type) concentration of from 1e19 atoms/cm$^3$ to 1e21 atoms/cm$^3$. The first conductivity-type source/drain regions 16 have a thickness that is typically within the range of the thickness of the first semiconductor channel material layer 14. The first conductivity-type source/drain regions 16 typically, but not necessarily always, have a same thickness as the first semiconductor channel material layer 14 such that a topmost surface of each of the first conductivity-type source/drain regions 16 is coplanar with a topmost surface of the first semiconductor channel material layer 14.

The first gate dielectric material layer 18 is composed of a first gate dielectric material such as, for example, silicon dioxide, or a dielectric material having a dielectric constant greater than 4.0 (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite ($Pb(Zn,Nb)O$). The high-k gate dielectric material can further include dopants such as lanthanum (La), aluminum (Al) and/or magnesium (Mg). The first gate dielectric material layer 18 can include one or more of the above mentioned first gate dielectric materials. The first gate dielectric material layer 18 can have a thickness from 1 nm to 20 nm; although other thicknesses for the first gate dielectric material layer 18 are contemplated and can be employed in the present application.

The first gate electrode 20 is composed of a first gate electrode material. In some embodiments, the first gate electrode material is composed of an electrically conductive metal-containing material including, but not limited to, tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide ($TaC_x$), titanium carbide (TiC), titanium aluminum carbide, tungsten silicide ($WSi_2$), tungsten nitride (WN), ruthenium oxide ($RuO_2$), cobalt silicide, or nickel silicide.

In other embodiments, the first gate electrode material is composed of a first work function metal (WFM). The first WFM can be used to set a threshold voltage of FET_1 to a desired value. In some embodiments, the first WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the first WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof.

In some embodiments, the first gate electrode material that provides the first gate electrode 20 is a multilayered stack of an electrically conductive metal-containing material, and a first WFM.

The first gate electrode 20 can have a thickness from 10 nm to 100 nm; although other thicknesses for the first gate electrode 20 are contemplated and can be employed in the present application.

The first gate spacer 22 is composed of any dielectric spacer material including, but not limited to, silicon dioxide, silicon nitride, and/or silicon oxynitride. The first gate spacer 22 is present entirely along the sidewall of the first gate electrode 20.

The semiconductor material layer 24 is composed of a fourth semiconductor material that can be compositionally the same as, or compositionally different from, the third semiconductor material that provides the first conductivity-type source/drain regions 16. In some embodiments, the fourth semiconductor material that provides the semiconductor material layer 24 is an intrinsic, i.e., non-doped, semiconductor material. In other embodiments, the fourth semiconductor material that provides the semiconductor material layer 24 is a doped semiconductor material having a dopant concentration of 5e18 atoms/cm$^3$ or less. In some embodiments, the doped semiconductor material that provides the semiconductor material layer 24 includes a p-type dopant, as defined above. In other embodiments, the doped semiconductor material that provides the semiconductor material layer 24 includes an n-type dopant, as defined above. In embodiments of the present application, the fourth semiconductor material that provides the semiconductor material layer 24 is a polycrystalline semiconductor material, such as, for example, polycrystalline silicon. The semiconductor material layer 24 can have a thickness from 20 nm to 50 nm; although other thicknesses for the semiconductor material layer 24 are contemplated and can be employed in the present application. The semiconductor material layer 24 typically has a topmost surface that is coplanar with at least a topmost surface of the first gate electrode 20. The semiconductor material layer 24 is spaced apart from the sidewalls of the first gate electrode 20 by the first gate spacer 22.

The second semiconductor channel material layer 26 is composed of a fifth semiconductor material. The fifth semiconductor material that provides the second semiconductor channel material layer 26 can include one of the semiconductor materials mentioned above for the first semiconductor material that provides the base semiconductor material layer 10. In one example, the fifth semiconductor material that provides the second semiconductor channel material layer 26 is composed of Si or Ge. In some embodiments, the fifth semiconductor material that provides the second semiconductor channel material layer 26 can be compositionally the same as the second semiconductor material that provides the first semiconductor channel material layer 14. In other embodiments, the fifth semiconductor material that provides the second semiconductor channel material layer 26 can be compositionally different from the second semiconductor material that provides the first semiconductor channel material layer 14.

In some embodiments, the fifth semiconductor material that provides the second semiconductor channel material layer 26 is capable of providing high channel mobility for an nFET. In other embodiments, the fifth semiconductor material that provides second semiconductor channel material layer 26 is capable of providing high channel mobility for a pFET. The second semiconductor channel material layer 26 can have a thickness from 20 nm to 50 nm; although other thicknesses for the second semiconductor channel material layer 26 are contemplated and can be employed in the present application. The second channel material layer 26 may also be composed of fins or sheets.

The second conductivity-type source/drain regions 28 are composed of a sixth semiconductor material that can be compositionally the same as, or compositionally different from, the fifth semiconductor material that provides the second semiconductor channel material layer 26. Typically, the sixth semiconductor material that provides the second conductivity-type source/drain regions 28 and the fifth semiconductor material that provides the second semiconductor channel material layer 26 are compositionally the same, e.g., both are composed of Si. The sixth semiconductor material that provides the second conductivity-type source/drain regions 28 are doped with either a p-type dopant, as defined above, or an n-type dopant, as defined above. The conductivity type of the dopant that is present in the second conductivity-type source/drain regions 28 is opposite from the conductivity type of dopant that is present in the first conductivity type source/drain regions 14. In one example, the first conductivity-type source/drain regions 16 are p-doped regions, and the second conductivity-type regions 28 are n-doped regions. In another example, the first conductivity-type source/drain regions 16 are n-doped regions, and the second conductivity-type regions 28 are p-doped regions. The second conductivity-type source/drain regions 28 can have a dopant (p-type or n-type) concentration of from 1e19 atoms/cm$^3$ to 1e21 atoms/cm$^3$. The second conductivity-type source/drain regions 28 have a thickness that is typically within the range of the thickness of the second semiconductor channel material layer 26. The second conductivity-type source/drain regions 28 typically, but not necessarily always, have a same thickness as the second semiconductor channel material layer 26 such that a topmost surface of each of the second conductivity-type source/drain regions 28 is coplanar with a topmost surface of the second semiconductor channel material layer 26.

The second gate dielectric material layer 30 is composed of a second gate dielectric material. The second gate dielectric material includes at least one of the first gate dielectric materials mentioned above. The second gate dielectric material that provides the second gate dielectric material layer 30 can be compositionally the same as, or compositionally different from, the first gate dielectric material that provide the first gate dielectric material layer 18. The second gate dielectric material layer 30 can have a thickness from 1 nm to 20 nm; although other thicknesses for the second gate dielectric material layer 30 are contemplated and can be employed in the present application.

The second gate electrode 32 is composed of a second gate electrode material. In some embodiments, the second gate electrode material that provides the second gate electrode 32 is composed of one of the electrically conductive metal-containing materials mentioned above for the first gate electrode 20. In other embodiments, the second gate electrode material is composed of a second work function metal (WFM). The second WFM is compositionally different from the first WFM. The second WFM can be used to set a threshold voltage of FET_2 to a desired value. In some embodiments, the second WFM can be selected to effectuate an n-type threshold voltage shift, as defined above. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof. In other embodiments, the second WFM can be selected to effectuate a p-type threshold voltage shift, as defined above. Examples of such materials that can effectuate a p-type threshold voltage shift include, but are not limited to, titanium nitride, and tantalum carbide, hafnium carbide, and combinations thereof. In yet other embodiments, the second gate electrode material that provides the second gate electrode 32 is composed of both an electrically conductive metal-containing material and a second WFM. The second gate electrode 32 can have a thickness from 10 nm to 100 nm; although other thicknesses for the second gate electrode 32 are contemplated and can be employed in the present application.

The second gate spacer 34 is composed of any dielectric spacer material including, but not limited to, silicon dioxide, silicon nitride, and/or silicon oxynitride. The second gate spacer 34 is present entirely along the sidewall of the second gate electrode 32.

It is noted that the channel width of FET_1 and FET_2 can be the same as is illustrated in FIG. 1, or the channel width of FET_1 can be different from the channel width of FET_2. As stated above, FET_1 is of the first conductivity type and FET_2 is of the second conductivity type. Thus and in some embodiments, FET_1 is an nFET, while FET_2 is a pFET. In other embodiments, FET_1 is a pFET and FET_2 is an nFET.

Figure 2:
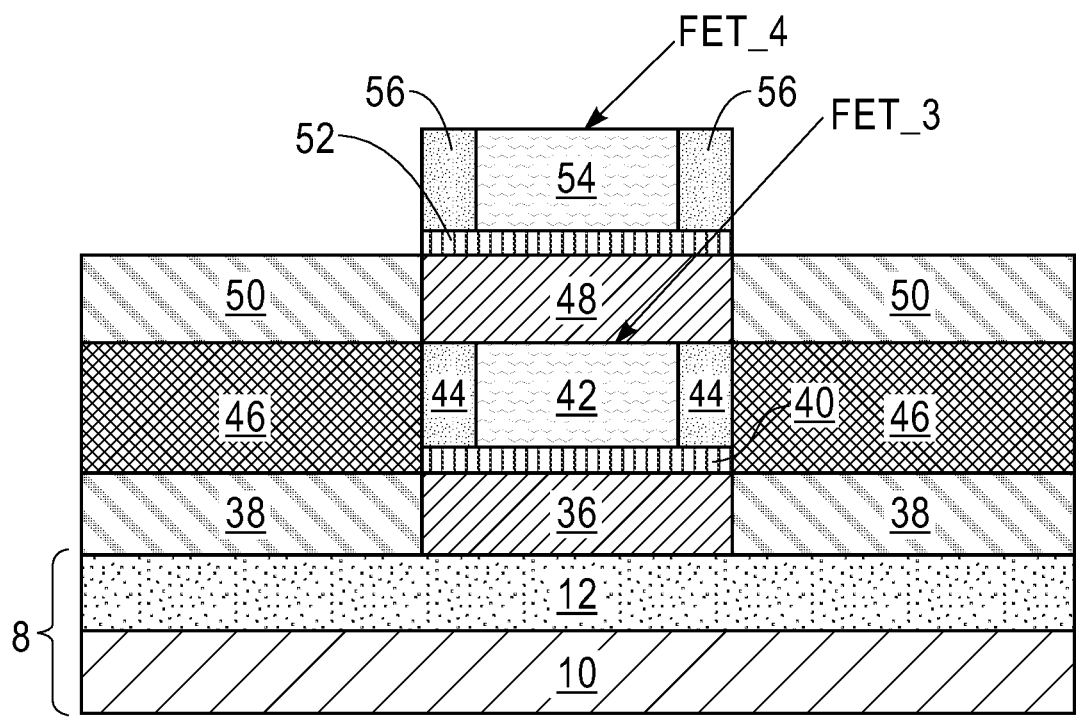
FIG. 2 is a cross sectional view of a stacked FET located in a stacked FET device region of the semiconductor substrate.

In some embodiments of the present application and as is illustrated in FIG. 2, the semiconductor structure can further include a stacked FET located in a stacked FET device region of the semiconductor substrate 8. In the present application, the stacked FET device region is located adjacent to the diode region of the semiconductor structure 8. That is, the stacked FET shown in FIG. 2 is located adjacent to the stacked FET vertical diode illustrated in FIG. 1; the stacked FET and the stacked FET vertical diode are located on the same substrate, i.e., semiconductor substrate 8. The stacked FET illustrated in FIG. 2 includes a third FET, FET_3, having third conductivity type source/drain regions 38, and a fourth FET, FET_4, located above FET_3 and having fourth conductivity type source/drain regions 50. In the stacked FET device region, a dielectric material layer 46 electrically insulates the third conductivity type source/drain regions 38 of FET_3 from the fourth conductivity type source/drain regions 50 of FET_4. In embodiments, the stacked FET is located at a same device level as the stacked FET vertical diode.

In some embodiments, the third conductivity type source/drain regions 38 are of the same conductivity type as the fourth conductivity type source/drain regions 50, i.e., both are n-type or both are p-type. In such an embodiment, FET_3 and FET_4 are of the same conductivity. In other embodiments, the third conductivity type source/drain regions 38 are a different conductivity type than the fourth conductivity type source/drain regions 50. In some embodiments and for ease of fabrication, the third conductivity type source/drain regions 38 are of a same conductivity type as the first source/drain regions 16 of FET_1, and the fourth conductivity type source/drain regions 50 are of the same conductivity type as the second source/drain regions 28 of FET_2. In such a case, FET_3 is of a same conductivity type as FET_1 and of opposite conductivity type than both FET_2 and FET_4.

FET_3 of the stacked FET illustrated in FIG. 2 includes a third semiconductor channel material layer 36 located laterally between each of the third conductivity type source/drain regions 38, and FET_4 of the stacked FET illustrated in FIG. 2 includes a fourth semiconductor channel material layer 48 located laterally between each of the fourth conductivity type source/drain regions 50.

As is further illustrated in FIG. 2, FET_3 includes a third gate dielectric material layer 40 located on the third semiconductor channel material layer 38 and a third gate electrode 42 located on the third gate dielectric material layer 40, while FET_4 includes a fourth gate dielectric material layer 52 located on the fourth semiconductor channel material layer 48 and a fourth gate electrode 54 located on the fourth gate dielectric material layer 52.

As is further illustrated in FIG. 2, a third gate spacer 44 is located on the third gate dielectric material layer 40 and contacts a sidewall of the third gate electrode 42, and a fourth gate spacer 56 is located on the fourth gate dielectric material layer 52 and contacts a sidewall of the fourth gate electrode 54. As is even further illustrated in FIG. 2, the third gate spacer 44 further contacts the dielectric material layer 46 that vertically separates the third conductivity type source/drain regions 38 from the fourth conductivity type source/drain regions 50.

The various components/elements depicted in FIG. 2 will now be described in greater detail. Semiconductor substrate 8 can include the base semiconductor material layer 10 and, optionally the insulator layer 12, as defined above.

The third semiconductor channel material layer 36 is composed of a seventh semiconductor material. The seventh semiconductor material that provides the third semiconductor channel material layer 36 can include one of the semiconductor materials mentioned above for the first semiconductor material that provides the base semiconductor material layer 10. In some embodiments, the seventh semiconductor material layer that provides the third semiconductor channel material layer 36 is compositionally the same as the second semiconductor material layer that provides the first semiconductor channel material layer 14. In other embodiments, the seventh semiconductor material layer that provides the third semiconductor channel material layer 36 is compositionally different than the second semiconductor material layer that provides the first semiconductor channel material layer 14. In some embodiments, the seventh semiconductor material that provides the third semiconductor channel material layer 36 is capable of providing high channel mobility for an nFET. In other embodiments, the seventh semiconductor material that provides the third semiconductor channel material layer 36 is capable of providing high channel mobility for a pFET. The third semiconductor channel material layer 36 can have a thickness in the thickness range mentioned above for the first semiconductor channel material layer 14.

The third conductivity-type source/drain regions 38 are composed of an eighth semiconductor material that can be compositionally the same as, or compositionally different from, the seventh semiconductor material that provides the third semiconductor channel material layer 36. Typically, the eighth semiconductor material that provides the third conductivity-type source/drain regions 38 and the seventh semiconductor material that provides the third semiconductor channel material layer 36 are compositionally the same. The eighth semiconductor material layer that provides the third conductivity-type source/drain regions 38 can be compositionally the same as, or compositionally different from, the third semiconductor material that provides the first conductivity-type source/drain regions 16.

The eighth semiconductor material that provides the third conductivity-type source/drain regions 38 are doped with either a p-type dopant, as defined above, or an n-type dopant as defined above. The third conductivity-type source/drain regions 38 are of a same, or different, conductivity type as the first conductivity type source/drain regions 16. Typically, the third conductivity-type source/drain regions 38 and the first conductivity type source/drain regions 16 are of same conductivity type. The dopant concentration in the eighth semiconductor material that provides the third conductivity-type source/drain regions 38 is within the dopant range mentioned above for the third semiconductor material that first conductivity-type source/drain regions 16. The thickness of the third conductivity-type source/drain regions 38 is typically within the range of the thickness of the third semiconductor channel material layer 36. The third conductivity-type source/drain regions 38 typically, but not necessarily always, have a same thickness as the third semiconductor channel material layer 36 such that a topmost surface of each of the third conductivity-type source/drain regions 38 is coplanar with a topmost surface of the third semiconductor channel material layer 36.

The third gate dielectric material layer 40 is composed of a third gate dielectric material. The third gate dielectric material includes one of the first gate dielectric materials mentioned above for the first gate dielectric material layer 18. The third gate dielectric material that provides the third gate dielectric material layer 40 can be compositionally the same as, or compositionally different from, the first gate dielectric material that provides the first gate dielectric material layer 18. The third gate dielectric material layer 40 can have a thickness within the thickness range mentioned above for the first gate dielectric material layer 18.

The third gate electrode 42 is composed of a third gate electrode material. The third gate electrode material includes one of the first gate electrode materials, i.e., electrically conductive metal-containing materials and/or WFMs, mentioned above for first gate electrode material that provides the first gate electrode 20. The third gate electrode material that provides the third gate electrode 42 can be compositionally the same as, or compositionally different from, the first gate electrode material that provides the first gate electrode 20. The third gate electrode 20 can have a thickness within the thickness range mentioned above for the first gate electrode 20.

The third gate spacer 44 is composed of any dielectric spacer material including, but not limited to, silicon dioxide, silicon nitride, and/or silicon oxynitride. The third gate spacer 44 is present entirely along the sidewall of the third gate electrode 42.

The dielectric material layer 46 is composed of a dielectric material that can be compositionally the same as, or compositionally different from, the dielectric spacer material that provides the third gate spacer 44. In one example, the dielectric material layer 46 is composed of silicon dioxide, while the third gate spacer 44 is composed of silicon nitride. The dielectric material layer 46 can have a thickness from 20 nm to 50 nm; although other thicknesses for the dielectric material layer 46 are contemplated and can be employed in the present application. The dielectric material layer 46 typically has a topmost surface that is coplanar with at least a topmost surface of the third gate electrode 42. The dielectric material layer 46 is spaced apart from the sidewalls of the third gate electrode 42 by the third gate spacer 44.

The fourth semiconductor channel material layer 48 is composed of a ninth semiconductor material. The ninth semiconductor material that provides the fourth semiconductor channel material layer 48 can include one of the semiconductor materials mentioned above for the first semiconductor material that provides the base semiconductor material layer 10. In some embodiments, the ninth semiconductor material that provides the fourth semiconductor channel material layer 48 can be compositionally the same as the seventh semiconductor material that provides third semiconductor channel material layer 36. In other embodiments, the ninth semiconductor material that provides the fourth semiconductor channel material layer 48 can be compositionally different from the seventh semiconductor material that provides the third semiconductor channel material layer 36. In some embodiments, the ninth semiconductor material that provides the fourth semiconductor channel material layer 48 can be compositionally the same as, or compositionally different from the fourth semiconductor material that provides second semiconductor channel material layer 26. In some embodiments, the ninth semiconductor material that provides the fourth semiconductor channel material layer 48 is capable of providing high channel mobility for an nFET. In other embodiments, the ninth semiconductor material that provides fourth semiconductor channel material layer 48 is capable of providing high channel mobility for a pFET. The fourth semiconductor channel material layer 48 can have a thickness from 20 nm to 50 nm; although other thicknesses for the fourth semiconductor channel material layer 48 are contemplated and can be employed in the present application.

The fourth conductivity-type source/drain regions 50 are composed of a tenth semiconductor material that can be compositionally the same as, or compositionally different from, the ninth semiconductor material that provides the fourth semiconductor channel material layer 48. The tenth semiconductor material that provides the fourth conductivity-type source/drain regions 50 are doped with either a p-type dopant, as defined above, or an n-type dopant as defined above. The conductivity type of the dopant that is present in the fourth conductivity-type source/drain regions 50 can be the same as, or opposite from, from the conductivity type of dopant that is present in the third conductivity type source/drain regions 36. The fourth conductivity-type source/drain regions 50 can have a dopant (p-type or n-type) concentration of from 1e19 atoms/cm$^3$ to 1e21 atoms/cm$^3$. The fourth conductivity-type source/drain regions 50 have a thickness that is typically within the range of the thickness of the fourth semiconductor channel material layer 48. The fourth conductivity-type source/drain regions 50 typically, but not necessarily always, have a same thickness as the fourth semiconductor channel material layer 48 such that a topmost surface of each of the fourth conductivity-type source/drain regions 50 is coplanar with a topmost surface of the fourth semiconductor channel material layer 40.

The fourth gate dielectric material layer 52 is composed of a fourth gate dielectric material. The fourth gate dielectric material includes at least one of the first gate dielectric materials mentioned above. The fourth gate dielectric material layer that provides the fourth gate dielectric material layer 52 can be compositionally the same as, or compositionally different from, the third and/or second gate dielectric materials mentioned above. The fourth gate dielectric material layer 52 can have a thickness from 1 nm to 20 nm; although other thicknesses for the fourth gate dielectric material layer 52 are contemplated and can be employed in the present application.

The fourth gate electrode 54 is composed of a fourth gate electrode material. The fourth gate electrode material that provides the fourth gate electrode 54 includes one of the first gate electrode materials, i.e., electrically conductive metal-containing materials and/or WFMs, mentioned above for first gate electrode material that provides the first gate electrode 20. The fourth gate electrode material that provides the fourth gate electrode 54 can be compositionally the same as, or compositionally different from, the third gate electrode material that provides the provides the third gate electrode 20 and/or the second gate electrode material that provides the second gate electrode 32. The fourth gate electrode 54 can have a thickness within the thickness range mentioned above for the first gate electrode 20.

The fourth gate spacer 56 is composed of any dielectric spacer material including, but not limited to, silicon dioxide, silicon nitride, and/or silicon oxynitride. The fourth gate spacer 56 is present entirely along the sidewall of the fourth gate electrode 42.

It is noted that the channel width of FET_3 and FET_4 can be the same as is illustrated in FIG. 2, or the channel width of FET_3 can be different from the channel width of FET_4. In some embodiments, FET_3 and FET_4 are both nFETs. In other embodiments, FET_3 and FET_4 are both pFETs. In yet other embodiments, FET_3 is an nFET, and FET_4 is a pFET. In yet furth embodiments, FET_3 is a pFET, and FET_4 is an nFET.

When the stacked FET vertical diode and the stacked FET are both present, the following are possible (1) FET_1 is an nFET, FET_2 is a pFET, and FET_3 and FET_4 are both nFETs; (2) FET_1 is an nFET, FET_2 is a pFET, and FET_3 and FET_4 are both pFETs; (3) FET_1 is an nFET, FET_2 is a pFET, FET_3 is an nFET, and FET_4 is a pFET; (4) FET_1 is an nFET, FET_2 is a pFET, FET_3 is a pFET, and FET_4 is an nFET; (5) FET_1 is pFET, FET_2 is an nFET, and FET_3 and FET_4 are both nFETs; (6) FET_1 is a pFET, FET_2 is an nFET, and FET_3 and FET_4 are both pFETs; (7) FET_1 is a pFET, FET_2 is an nFET, FET_3 is an nFET, and FET_4 is a pFET; and (8) FET_1 is a pFET, FET_2 is an nFET, FET_3 is a pFET, and FET_4 is an nFET.

Although the present application describes and illustrates planar FETs for FET_1, FET_2, FET_3 and FET_4, the present application contemplates embodiments in which at least one of FET_1, FET_2, FET_3 and FET_4 is a non-planar device such as, for example, a semiconductor fin-containing FET, a nanowire-containing FET, and/or a nanosheet-containing FET. For a semiconductor fin-containing FET, one of the semiconductor channel material layers is replaced with a semiconductor channel material fin. For a nanowire-containing FET, one of the semiconductor channel material layers is replaced with a nanowire or a vertical stack of nanowires. For a nanosheet-containing FET, one of the semiconductor channel material layers is replaced with a semiconductor channel material nanosheet or a vertical stack of semiconductor channel material nanosheets. In the present application, the semiconductor channel material layers, nanosheets, nanowires and fins represent a semiconductor channel material region of a FET.

The stacked FET vertical diode and the stacked FET shown in FIGS. 1 and 2, respectively, can be formed utilizing any conventional stacked FET device process. Notably, the stacked FET vertical diode and the stacked FET shown in FIGS. 1 and 2, respectively, can be formed utilizing various deposition steps including, for example, chemical vapor deposition (CVD), plasma enhanced chemical vapor deposition (PECVD), physical vapor deposition (PVD), atomic layer deposition (ALD), evaporation and/or sputtering. In addition to using various deposition processes, the stacked FET vertical diode and the stacked FET shown in FIGS. 1 and 2, respectively, can also include various patterning steps. Patterning can include lithography and etching. For the various doped semiconductor materials that are present in the stacked FET vertical diode and the stacked FET shown in FIGS. 1 and 2, the doped semiconductor material layers can be formed by first depositing a semiconductor material, and then introducing a dopant into the deposited semiconductor material by ion implantation or gas phase doping. The deposition of the semiconductor material can include, for example, CVD, PECVD or epitaxial growth process in which the dopant is introduced after the epitaxial growth process. In other embodiment, the doped semiconductor material layers can be formed by an epitaxial growth process in which the dopant is present as one of the reactant precursors.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a stacked field effect transistor (FET) vertical diode located in a diode region of a semiconductor substrate, wherein the stacked FET vertical diode comprises a first FET having first conductivity type source/drain regions, a second FET located above the first FET and having second conductivity type source/drain regions that are of an opposite conductivity than the first conductivity type source/drain regions, and a semiconductor material layer electrically connecting the first conductivity type source/drain regions of the first FET with the second conductivity type source/drain regions of the second FET.

2. The semiconductor structure of claim 1, wherein the first conductivity type is n-type and the second conductivity type is p-type.

3. The semiconductor structure of claim 1, wherein the first conductivity type is p-type and the second conductivity type is n-type.

4. The semiconductor structure of claim 1, wherein the semiconductor material layer is an intrinsic semiconductor material.

5. The semiconductor structure of claim 1, wherein the semiconductor material layer is a doped semiconductor material having a dopant concentration of 5e18 atoms/cm$^3$ or less.

6. The semiconductor structure of claim 5, wherein the doped semiconductor material comprises a p-type dopant.

7. The semiconductor structure of claim 5, wherein the doped semiconductor material comprises an-type dopant.

8. The semiconductor structure of claim 1, wherein the semiconductor material layer is a polycrystalline semiconductor material.

9. The semiconductor structure of claim 8, wherein the polycrystalline semiconductor material is polycrystalline silicon.

10. The semiconductor structure of claim 1, further comprising a first semiconductor channel material region located laterally between each of the first conductivity type source/drain regions, and a second semiconductor channel material region located laterally between each of the second conductivity type source/drain regions.

11. The semiconductor structure of claim 10, wherein the first FET comprises a first gate dielectric material layer located on the first semiconductor channel material region and a first gate electrode located on the first gate dielectric material layer, and the second FET comprises a second gate dielectric material layer located on the second semiconductor channel material region and a second gate electrode located on the second gate dielectric material layer.

12. The semiconductor structure of claim 11, further comprising a first gate spacer located on the first gate dielectric material layer and contacting a sidewall of the first gate electrode, and a second gate spacer located on the second gate dielectric material layer and contacting a sidewall of the second gate electrode.

13. The semiconductor structure of claim 12, wherein the first gate spacer further contacts the semiconductor material layer.

14. The semiconductor structure of claim 1, wherein the semiconductor substrate comprises an insulator layer located on a base semiconductor material layer, and the insulator layer contacts each of the first conductivity type source/drain regions.

15. The semiconductor structure of claim 1, wherein the semiconductor substrate comprises a base semiconductor material layer, and the base semiconductor material layer contacts each of the first conductivity type source/drain regions.

16. The semiconductor structure of claim 1, further comprising a stacked FET located in a stacked FET device region of the semiconductor substrate, wherein the stacked FET device region is located adjacent to the diode region of the semiconductor substrate.

17. The semiconductor structure of claim 16, wherein the stacked FET comprises a third FET having third conductivity type source/drain regions, a fourth FET located above the third FET and having fourth conductivity type source/drain regions, and a dielectric material layer electrically insulating the third conductivity type source/drain regions of the third FET from the fourth conductivity type source/drain regions of the fourth FET.

18. The semiconductor structure of claim 17, wherein the dielectric material layer comprises silicon dioxide, silicon nitride, silicon oxynitride or any combination thereof.

19. The semiconductor structure of claim 17, wherein the third conductivity type is n-type and the fourth conductivity type is p-type.

20. The semiconductor structure of claim 17, wherein the third conductivity type is p-type and the fourth conductivity type is n-type.

* * * * *